Oct. 27, 1964 W. SHOCKLEY 3,154,692

VOLTAGE REGULATING SEMICONDUCTOR DEVICE

Filed Jan. 8, 1960

WILLIAM SHOCKLEY
*INVENTOR.*

BY *Flehr and Swain*
ATTORNEYS

United States Patent Office 3,154,692

Patented Oct. 27, 1964

3,154,692
VOLTAGE REGULATING SEMICONDUCTOR DEVICE

William Shockley, Los Altos, Calif., assignor to Clevite Corporation, Cleveland, Ohio, a corporation of Ohio Filed Jan. 8, 1960, Ser. No. 1,256
2 Claims. (Cl. 307—88.5)

This invention relates generally to a voltage regulating device and more particularly to a semiconductive voltage regulating device which is insensitive to surface conditions.

One of the problems encountered when employing semiconductive voltage regulating or avalanche devices is that surface conditions will alter the characteristics of the device, that is, the regulating voltage and current flow through the device. Changes in surface conditions at an exposed junction which is near avalanche breakdown voltage causes bursts of noise, and consequently poor regulation.

It is a general object of the present invention to provide a semiconductive device which is relatively insensitive to changes in surface conditions.

It is another object of the present invention to provide a device in which surface leakage currents are ohmic in nature.

It is a further object of the present invention to provide a semiconductive device in which the regulating or avalanche junction is connected to the surface of the device through a high resistance so that the leakage across the junction is relatively unimportant.

It is a further object of the present invention to provide a semiconductive device in which no p-n junction reaches the surface of the device.

It is a further object of the present invention to provide a semiconductive device including a p-n junction having an avalanche or zener regulating region and a surrounding ohmic region.

These and other objects of the invention will be more clearly understood from the following description taken in conjunction with the accompanying drawing.

Referring to the drawing.

Figure 1:
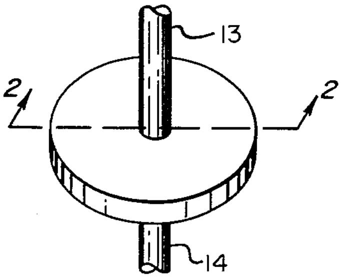
FIGURE 1 is a perspective view of a device in accordance with the present invention.

Referring to FIGURE 1, a wafer of semiconductive material, for example, p-type material is subjected to diffusion so that a very thin diffused surface layer of n-type material is formed. A method of obtaining very thin uniform layers is described in copending application Ser. No. 842,464, filed Sept. 25, 1959, now Patent No. 3,041,214. The p- and n-types materials form a p-n junction 11. Ohmic contacts 13 and 14 are made on opposite sides near the center of the wafer. The contacts may, for example, be formed by soldering 16 to the surface layer. The device formed is a three layer voltage regulating device and operates in the manner set forth in copending application Serial No. 811,838, filed May 8, 1959.

For small voltages applied between the contacts 13 and 14, there will be an ohmic current path around the surface of the device. The resistance offered to current flow may be made relatively high by making the diffused layer very thin and making the diameter of the disc large in comparison to the diameter of the contacts.

At higher voltages, the total voltage drop across the p-n junctions on the top and bottom sides of the disc in the portion adjacent the contacts will exceed the breakdown voltage and breakdown current (avalanche or zener) will flow between the contacts across one of the junctions. No breakdown current will flow at remote portions of the junction because of the voltage drop along the surface layer. In essence then, the breakdown region is confined to the relatively small portion of the p-n junction adjacent the ohmic contacts.

The resistance offered to current flow along the surface is given by the following expression:

$$I=2\pi r g_s dV/dr \qquad (1)$$

$$I/V=2\pi g_s/\ln(r_2/l_1) \qquad (2)$$

where $I$=current,
$g_s$=conductance per square,
$V$=voltage,
$r_1$=radius of the contacts, and
$r_2$=radius of the outer periphery of the circular disc.

Figure 2:
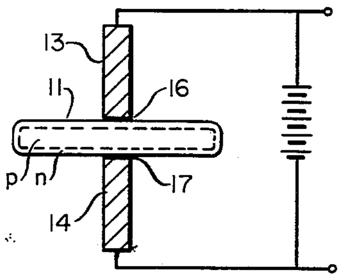
FIGURE 2 is a sectional view taken along the lines 2—2 of FIGURE 1.

For the disc shown in FIGURE 2, the resistance will be twice that given for Equation 2 plus a small term for the resistance along the outer edges of the disc.

By way of example, if $g_s=5\times10^{-4}$ mho, the resistance for the case in which the ratio of inner to outer diameters is 1:3 will be approximately 1,000 ohms. If the breakdown voltage is 10 volts, then the leakage current through the n-type surface layer will be only 1 milliamp.

This leakage current, being ohmic in nature, will contribute substantially no noise. Since there is no exposed junction, humidity effects will have no more influence on this device than they would upon ohmic leakage over an insulator.

In certain instances, it may be desirable to provide a better mechanical support and a heat sink for heat generated in the avalanche device. These aims may be realized with a device of the type shown in FIGURE 3. The lower contact is made in the form of a metal block 21 and placed in ohmic contact with the lower surface of the device.

The upper contact 13*a* is a small area ohmic contact. It is observed that the ohmic or series resistance along the n-type layer will be approximately one-half of that for the device shown in FIGURE 1. However, it may be desirable to employ a device of this type because of the greater mechanical strength and better heat dissipation characteristics.

Figure 3:
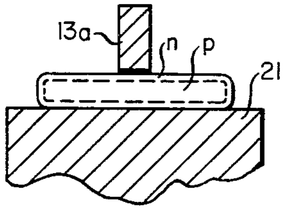
FIGURE 3 is a sectional view of another device in accordance with the invention.
Figure 4:
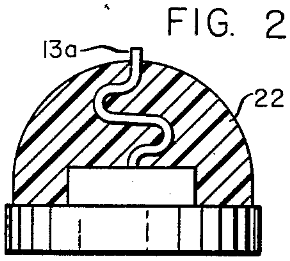
FIGURE 4 shows an encapsulated device.

The device of FIGURE 3 may be encapsulated as shown in FIGURE 4 and the wire contact embedded in plastic 22 and brought out through the top. The wire is bent to prevent it from being pulled loose in the plastic when it is mounted in associated equipment.

Figure 5:
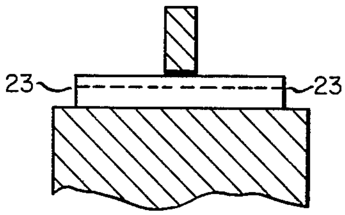
FIGURE 5 shows still another device in accordance with the present invention.

FIGURE 5 illustrates another embodiment of the invention. In this structure, the advantage is that a large slice of silicon may be diffused over its entire surface and then diced into chips which can be mounted individually. It has the disadvantage that an exposed junction 23 occurs. However, the exposed junction is connected to the output by a resistance equal to the resistance of the n-type upper layer. Any noise signals or leakage current generated across the exposed p-n junction are relatively unimportant when the device is operated at breakdown.

The currents at the exposed junction are relatively small in comparison to the breakdown currents flowing across the active junction portion.

Figure 6:
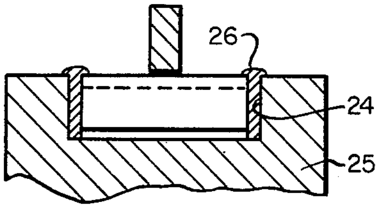
FIGURE 6 shows another mounting for a device of the type shown in FIGURE 5.

FIGURE 6 illustrates another embodiment of the invention similar to that in FIGURE 5 in which the noise of the exposed junction is minimized at the expense of increasing the leakage currents. In this structure, the device is soldered inside a well 24 formed in a block of material 25. The exposed junction is shorted by a suitable soft metal or metal alloy 26, for example, solder.

It is observed that, in each of the devices with thin diffused layers, as one proceeds away from the area in which breakdown is occurring, the voltage across the p-n junction decreases due to the ohmic voltage drop in the thin layer. The number of carriers required to prevent "punch-through" from occurring decreases as one proceeds radially outward from the contacts. This permits increasing the series resistance of the layer as one proceeds outwardly.

Very high concentrations in a thin layer are desirable since high concentrations reduce the mobility of carriers. Thus, if a given number of donors or acceptors per unit area of the thin layer is needed to prevent "punch-through," it is desirable to concentrate this number in a very thin layer so as to have low mobility and high surface resistance.

The following equations illustrate the method of calculating values for optimum surface conduction.

$$Q_s = qN_s = KE_B \cong (10^{-12}\text{ farad/cm.})\ (500{,}000\text{ volts/cm.}) = 5\times 10^{-7}\text{ coulomb/cm.}^2 \quad (3)$$

$$g_s = \mu_s Q_s = (100\text{ cm.}^2\text{/volt sec.})\times(5\times 10^{-7}\text{ coulomb/cm.}^2) = 5\times 10^{-5}\text{ mho} = (20{,}000\text{ ohms})^{-1} \quad (4)$$

where $Q_s$=charge on mobile carriers per unit area,
$q$=charge on the electron,
$N_s$=number of mobile carriers per unit area,
$K$=dielectric constant
$E_B$=electric field to produce avalanche breakdown
$g_s$=surface conductance or mhos per square
$\mu_s$=surface mobility Equation 3 shows the charge $Q_s$ per unit area which must exist upon donors to prevent punch-through of a layer and must be equal to the dielectric constant times the breakdown field. For values representative of silicon, Equation 3 shows that $Q_s$ is about one-half of a micro coulomb per square centimeter. In heavily doped layers, the mobility of holes or electrons is less than 100 centimeters squared per volt second. See, for example, Conwell, Proceedings of the IRE, June 1958. This results in a value of $g_s$, the conductance per square given in Equation 4. For safe design, it would probably be desirable to have several times as many donors or acceptors in the thin diffused layer as necessary to prevent punch-through. Under these circumstances, conductance in the order of $10^{-4}$ mhos per square can be used. For a very exacting design, it would be possible to operate with less than this number so that leakage resistances of the order of 100,000 ohms might be obtained.

Figure 7:
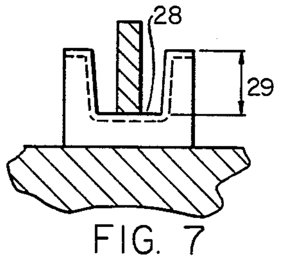
FIGURE 7 shows a device with increased series resistance.
Figure 8:
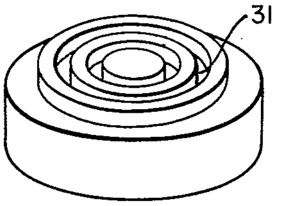
FIGURE 8 shows still another device having increased surface resistance.

It is apparent that larger series resistance can be obtained by increasing the surface path. The increased surface path can be obtained in a device of predetermined size by recessing the surface. This is illustrated in FIGURES 7 and 8. In FIGURE 7 the device is recessed 28 to thereby increase the surface path by an amount corresponding to the depth 29 of the recess. In FIGURE 8 there is shown a structure which includes a plurality of concentric grooves 31.

Devices having uniform layers and junctions have been described. However, in many instances, it may be advantageous to employ devices having different characteristics at different portions of the layers and junction. In this manner, it may be possible to compensate the breakdown voltage as thought in copending application Serial No. 782,782, filed December 24, 1958, now abandoned, to prevent punch-through in other portions of the junction, and to control other characteristics.

Various techniques for producing devices having different characteristics in different portions are set out in said copending application Serial No. 782,782, filed December 24, 1958. In general, masking and etching techniques are suitable for forming devices of this character.

Figure 9:
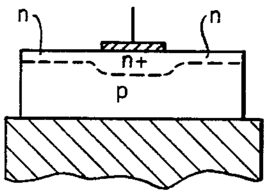
FIGURE 9 shows still another device in accordance with the invention including a layer having two different impurity concentrations.

One type of such device is shown in FIGURE 9 wherein the upper thin n-type layer includes a thicker n+ portion surrounded by a thin n portion which increases the surface resistance. The n+ portion controls the breakdown characteristics of the p-n junction since the concentration gradient is higher.

Throughout the disclosure reference is made to breakdown voltage and to breakdown currents. It will be evident that this refers to both Zener and avalanche breakdown voltage and current.

I claim:

1. A semiconductive device having at least a base layer and a surface layer of semiconductive material forming a rectifying junction therewith, means for applying a voltage across a portion of said junction to cause breakdown, the surface layer of said device having a conductance $$g_s = \mu_s Q_s$$

where $Q_s = qN_s = KE_B$
$g_s$=surface conductance or mhos per square,
$Q_s$=charge on mobile carriers per unit area,
$q$=charge on the electron,
$N_s$=number of mobile carriers per unit area,
$K$=dielectric constant,
$E_B$=electric field to produce avalanche breakdown,
$\mu_s$=surface mobility.

2. A semiconductive device having at least a base layer and a surface layer of semiconductive material forming a rectifying junction therewith, means for applying a voltage across a portion of said junction to cause breakdown, the surface layer of said device having a conductance less than $$g_s = \mu_s Q_s$$

where $Q_s = qN_s = KE_B$
$g_s$=surface conductance or mhos per square,
$Q_s$=charge on mobile carriers per unit area,
$q$=charge on the electron,
$N_s$=number of mobile carriers per unit area,
$K$=dielectric constant,
$E_B$=electric field to produce avalanche breakdown,
$\mu_s$=surface mobility.

References Cited in the file of this patent

UNITED STATES PATENTS

| | | |
|---|---|---|
| 2,816,850 | Haring | Dec. 17, 1957 |
| 2,854,366 | Wannlund et al. | Sept. 30, 1958 |
| 2,878,147 | Beale | Mar. 17, 1959 |
| 2,912,354 | Jung | Nov. 10, 1959 |
| 2,919,388 | Ross | Dec. 29, 1959 |
| 2,921,362 | Nomura | Jan. 19, 1960 |
| 2,943,006 | Henkels | June 28, 1960 |
| 2,954,486 | Doucette et al. | Sept. 27, 1960 |
| 3,022,568 | Nelson et al. | Feb. 27, 1962 |
| 3,032,695 | Zielasek | May 1, 1962 |
| 3,065,392 | Pankove | Nov. 20, 1962 |

OTHER REFERENCES

Hurley: Junction Transistor Electronics, 1958, John Wiley & Sons, Inc., New York, pages 153–154 relied on.